(12) United States Patent
Kang et al.

(10) Patent No.: US 8,080,886 B2
(45) Date of Patent: Dec. 20, 2011

(54) INTEGRATED CIRCUIT SEMICONDUCTOR DEVICE WITH OVERLAY KEY AND ALIGNMENT KEY AND METHOD OF FABRICATING THE SAME

(75) Inventors: Chang-Jin Kang, Suwon-si (KR);
Myeong-Cheol Kim, Suwon-si (KR);
Man-Hyoung Ryoo, Suwon-si (KR);
Si-Hyeung Lee, Gyeonggi-do (KR);
Doo-Youl Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 875 days.

(21) Appl. No.: 12/111,651

(22) Filed: Apr. 29, 2008

(65) Prior Publication Data
US 2008/0203590 A1     Aug. 28, 2008

(30) Foreign Application Priority Data
Jun. 13, 2003 (KR) .................................. 2003-38321

(51) Int. Cl.
*H01L 23/544* (2006.01)
(52) U.S. Cl. ................................. 257/797; 257/E23.179
(58) Field of Classification Search ................... 257/797
See application file for complete search history.

(56) References Cited

U.S. PATENT DOCUMENTS
2004/0102014 A1* 5/2004 Ning et al. .................... 438/393
* cited by examiner

*Primary Examiner* — Samuel Gebremariam
(74) *Attorney, Agent, or Firm* — F. Chau & Associates, LLC

(57) ABSTRACT

An integrated circuit semiconductor device including a cell region formed in a first portion of a silicon substrate, the cell region including a first trench formed in the silicon substrate, a first buried insulating layer filled in the first trench, a first insulating pattern formed over the silicon substrate, and a first conductive pattern formed over the first insulating pattern. An overlay key region is formed in a second portion of the silicon substrate and includes a second trench formed in the silicon substrate, a second insulating pattern formed over the silicon substrate and used as an overlay key, and a second conductive pattern formed over the second insulating pattern and formed by correcting overlay and alignment errors using the second insulating pattern. An alignment key region is formed in a third portion of the silicon substrate and includes a third trench formed in the silicon substrate and used as an alignment key, a second buried insulating layer formed in the third trench, and a third conductive pattern formed over the second buried insulating layer and the third trench.

9 Claims, 10 Drawing Sheets

INTEGRATED CIRCUIT SEMICONDUCTOR DEVICE WITH OVERLAY KEY AND ALIGNMENT KEY AND METHOD OF FABRICATING THE SAME

CROSS-REFERENCE TO RELATED APPLICATION

This application is a divisional of U.S. patent application Ser. No. 10/867,468, filed on Jun. 14, 2004 now U.S. Pat. No. 7,381,508, which in turn claims priority under 35 U.S.C. §119 to Korean Patent Application No. 10-2003-38321 filed on Jun. 13, 2003, the disclosures of which are each all incorporated herein by reference in their entirety.

BACKGROUND

1. Technical Field

The present disclosure relates to an integrated circuit semiconductor device and a method of fabricating the same. More particularly, the present invention relates to an integrated circuit semiconductor device with an overlay key and an alignment key and a method of fabricating the same.

2. Discussion of Related Art

Generally, when integrated circuit semiconductor devices are fabricated, unit devices are separated by forming a shallow trench and a buried insulating layer in a silicon substrate. The shallow trench is used as an alignment key for alignment of the silicon substrate in subsequent processing. This alignment key is a kind of pattern, which is required to align an exposure mask at a precise position when a predetermined pattern is formed on the silicon substrate. The alignment key is formed at the same time as a pattern of a cell region and in a scribe line so as not to affect the cell region. Also, when integrated circuit semiconductor devices are fabricated, many material patterns are formed on the silicon substrate using photolithography and etch processes. Thus, when a first material pattern is formed on the silicon substrate and a second material pattern is formed on the first material pattern, to overlay the second material pattern exactly on the first material pattern, an overlay key is formed during the formation of the first material pattern. The overlay key is also formed in the scribe line so as not to affect the cell region.

FIGS. 1 through 4 are cross-sectional views illustrating a conventional method of fabricating an integrated circuit semiconductor device with an overlay key and an alignment key.

Referring to FIG. 1, a cell region, an overlay key region, and an alignment key region are defined in a silicon substrate 11. In the alignment key region, a shallow trench 13 is formed by a shallow trench isolation (STI) technique in the silicon substrate 11. The shallow trench 13 functions as the alignment key.

Thereafter, a thin insulating layer 15 is formed on the entire surface of the silicon substrate 11 with the cell region, the overlay key region, and the alignment key region. The insulating layer 15 is formed in the trench 13 in the alignment key region.

Next, a first photoresist pattern 17 is formed on the insulating layer 15 to cover the alignment key region. The portion of the first photoresist pattern 17 formed in the cell region is used to form an integrated circuit semiconductor device and the portion of the first photoresist pattern 17 formed in the overlay key region is used to form an overlay key.

Referring to FIG. 2, the insulating layer 15 is etched using the first photoresist pattern 17 as a mask, thereby forming an insulating pattern 15a. The portion of the insulating pattern 15a formed in the cell region is used for the integrated circuit semiconductor device. On the other hand, the portion of the insulating pattern 15a formed in the overlay key region functions as the overlay key for correcting alignment errors in a subsequent conductive pattern formation process.

Referring to FIG. 3, a conductive layer 19 is formed on the entire surface of the silicon substrate 11 where the insulating pattern 15a is formed on the cell region, the overlay key region, and the alignment key region. Thereafter, a second photoresist pattern 21 is formed on the conductive layer 19 using a photolithography process so as to cover the alignment key region.

Since the insulating pattern 15a used as the overlay key is too thin (i.e., a step difference between the silicon substrate 11 and the insulating pattern 15a is small), position data of the insulating pattern 15a cannot be obtained using an optical laser of an overlay measuring apparatus. Thus, it is impossible for an overlay measuring apparatus to measure an overlay state between the second photoresist pattern 21 and the insulating pattern 15a and to correct the alignment errors.

Thus, the overlay state between the second photoresist pattern 21 and the insulating pattern 15 is measured in an indirect manner, i.e., by using the overlay measuring apparatus to measure the location of the alignment key, such that the alignment errors of the second photoresist pattern 21 can be corrected.

Referring to FIG. 4, the second conductive layer 19 is etched using the second photoresist pattern 21 as a mask, thereby forming a conductive pattern 19a. As described above, the alignment errors of the second photoresist pattern 21 are corrected using the alignment key instead of the overlay key formed of the insulating pattern 15a. As a result, as illustrated by reference character "a" in the cell region, large alignment errors occur between the insulating pattern 15a and the conductive pattern 19a.

As described above, in the conventional method of fabricating an integrated circuit semiconductor device with an overlay key and an alignment key, the thickness of the insulating pattern functioning as the overlay key is too small, and thus it is impossible to correct the alignment errors of the second photoresist pattern by using an overlay measuring apparatus. For this reason, the conventional method uses the alignment key in an indirect manner to correct the alignment errors of the second photoresist pattern. As a result, large alignment errors occur between the insulating pattern and the conductive pattern.

SUMMARY OF THE INVENTION

An integrated circuit semiconductor device according to an embodiment of the invention includes a cell region formed in a first portion of a silicon substrate, the cell region including a first trench formed in the silicon substrate, a first buried insulating layer filled in the first trench, a first insulating pattern formed over the silicon substrate, and a first conductive pattern formed over the first insulating pattern. An overlay key region is formed in a second portion of the silicon substrate and includes a second trench formed in the silicon substrate, a second insulating pattern formed over the silicon substrate and used as an overlay key, and a second conductive pattern formed over the second insulating pattern and formed by correcting overlay and alignment errors using the second insulating pattern. An alignment key region is formed in a third portion of the silicon substrate and includes a third trench formed in the silicon substrate and used as an alignment key, a second buried insulating layer formed in the third trench, and a third conductive pattern formed over the second buried insulating layer and the third trench.

Each of the first insulating pattern and the second insulating pattern may be formed of a material selected from a group consisting of $SiO_2$, SiON, $Si_3N_4$ and any combination thereof. Each of the first insulating pattern and the second insulating pattern may be formed of a triple layer of $SiO_2$, $Si_3N_4$, and $SiO_2$. Each of the first insulating pattern and the second insulating pattern may be formed to a thickness of about 100 Å to about 300 Å. Each of the first conductive pattern, the second conductive pattern, and the third conductive pattern may be formed of a doped polysilicon layer.

An integrated circuit semiconductor device according to another embodiment of the invention includes a cell region formed in a first portion of a silicon substrate, the cell region including a first trench formed in the silicon substrate, a first buried insulating layer filled in the first trench, a first insulating pattern formed over the silicon substrate, and a first conductive pattern formed over the first insulating pattern. An overlay key region may be formed in a second portion of the silicon substrate and includes a second trench formed in the silicon substrate, a second insulating pattern formed over the silicon substrate and used as an overlay key, and a second conductive pattern formed over the second insulating pattern and formed by correcting overlay and alignment errors using the second insulating pattern. An alignment key region is formed in a third portion of the silicon substrate and includes a third trench formed in the silicon substrate and used as an alignment key, a second buried insulating layer filled in the third trench, and a third conductive pattern formed over the second buried insulating layer and the silicon substrate.

A method of fabricating an integrated circuit semiconductor device according to an embodiment of the invention includes forming a first buried insulating layer and a second buried insulating layer in a first trench in a cell region and an alignment key region trench in an alignment key region, respectively, of a silicon substrate. A first insulating pattern and a second insulating pattern are formed in the cell region and an overlay key region, respectively, of the silicon substrate. The cell region is covered with a first photoresist pattern, and a second trench and a third trench are formed by etching the silicon substrate in the overlay key region and the alignment key region, respectively, by using the first photoresist pattern, the second insulating pattern and the second buried insulating layer as a mask. A conductive layer is formed over the entire surface of the silicon substrate including the cell region, the overlay key region, and the alignment key. A second photoresist pattern is formed over the conductive layer by using the third trench formed in the alignment key region as an alignment key and using the second insulating pattern as an overlay key. A conductive pattern is formed by patterning the conductive layer using the second photoresist pattern as a mask. Thus, the conductive pattern is formed by correcting overlay and alignment errors using the second insulating pattern.

Each of the first insulating pattern and the second insulating pattern may be formed of a material selected from a group consisting of $SiO_2$, SiON, $Si_3N_4$ and any combination thereof. Each of the first insulating pattern and the second insulating pattern may be formed of a triple layer of $SiO_2$, $Si_3N_4$, and $SiO_2$. Each of the first insulating pattern and the second insulating pattern may be formed to a thickness of about 100 Å to about 300 Å. Each of the first conductive pattern, the second conductive pattern, and the third conductive pattern may be formed of a doped polysilicon layer. The silicon substrate in the overlay key region and the alignment key region may be plasma etched using a gas selected from a group consisting of $Cl_2$ gas, HBr gas, and $BCl_3$ gas.

A method of fabricating an integrated circuit semiconductor device according to another embodiment of the invention includes forming a first buried insulating layer and a second buried insulating layer in a first trench in a cell region and an alignment key region trench in an alignment key region, respectively, of a silicon substrate. A first insulating pattern and a second insulating pattern are formed in the cell region and an overlay key region, respectively, of the silicon substrate. The cell region and the alignment key region are covered with a first photoresist pattern, and a second trench is formed by etching the silicon substrate in the overlay key region by using the first photoresist pattern and the second insulating pattern as a mask. A conductive layer is formed over the entire surface of the silicon substrate including the cell region, the overlay key region, and the alignment key region. A second photoresist pattern is formed over the conductive layer by using the first trench formed in the alignment key region as an alignment key and using the second insulating pattern as an overlay key. A conductive pattern is formed by patterning the conductive layer using the second photoresist pattern as a mask. Thus, the conductive pattern is formed by correcting overlay and alignment errors using the second insulating pattern.

In various exemplary embodiments of the present invention, since a step difference between an insulating pattern and an adjoining trench is sufficiently large, position data of the insulating pattern can be obtained using an optical laser of an overlay measuring apparatus. Thus, overlay and alignment errors between a photoresist pattern and the insulating pattern can be corrected.

BRIEF DESCRIPTION OF THE DRAWINGS

The present invention will become readily apparent by reference to the following detailed description when considered in conjunction with the accompanying drawings wherein.

DESCRIPTION OF PREFERRED EMBODIMENTS

Figure 1:
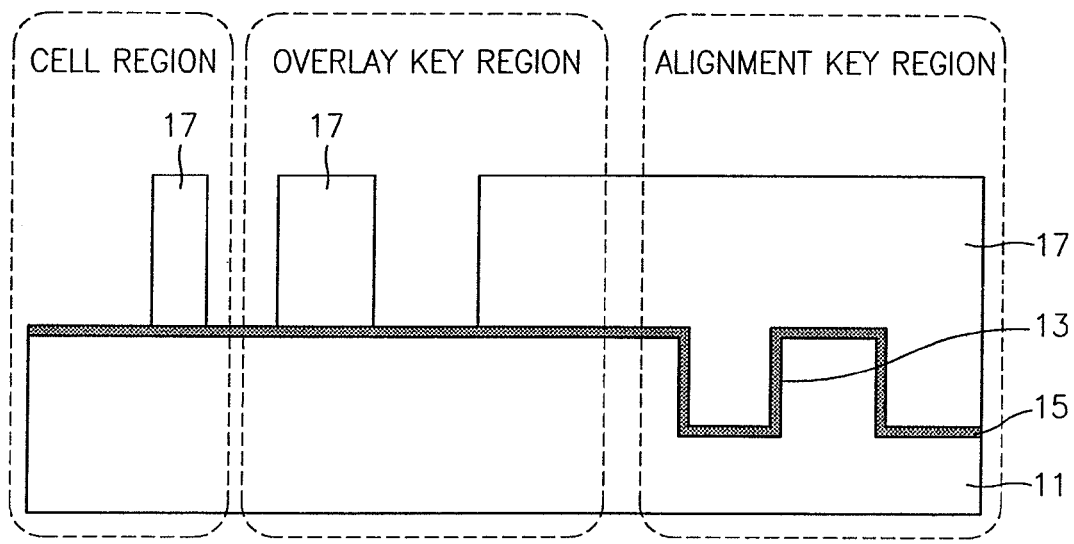
FIGS. 1 through 4 are cross-sectional views illustrating a conventional method of fabricating an integrated circuit semiconductor device with an overlay key and an alignment key.
Figure 2:
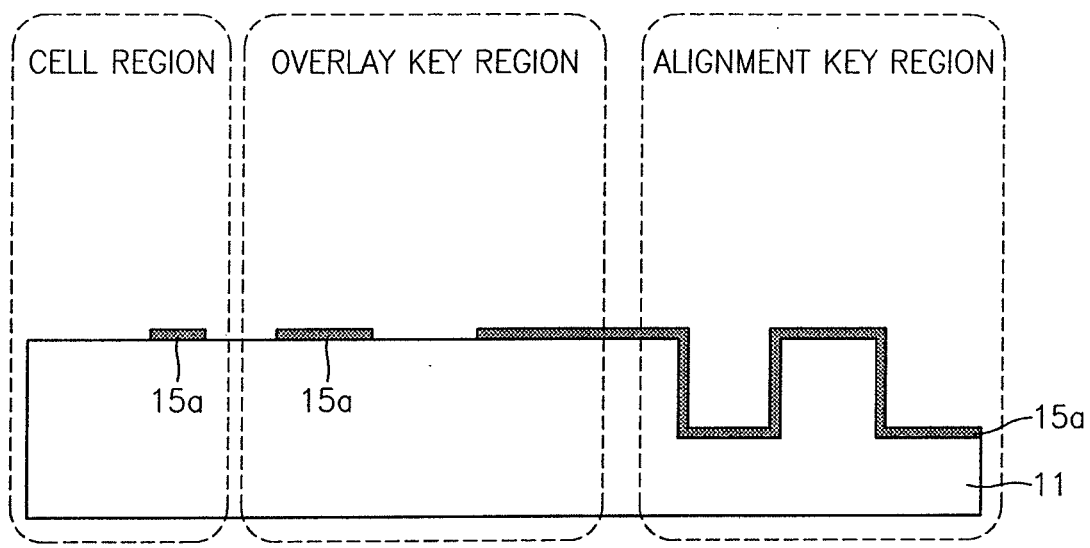
Figure 3:
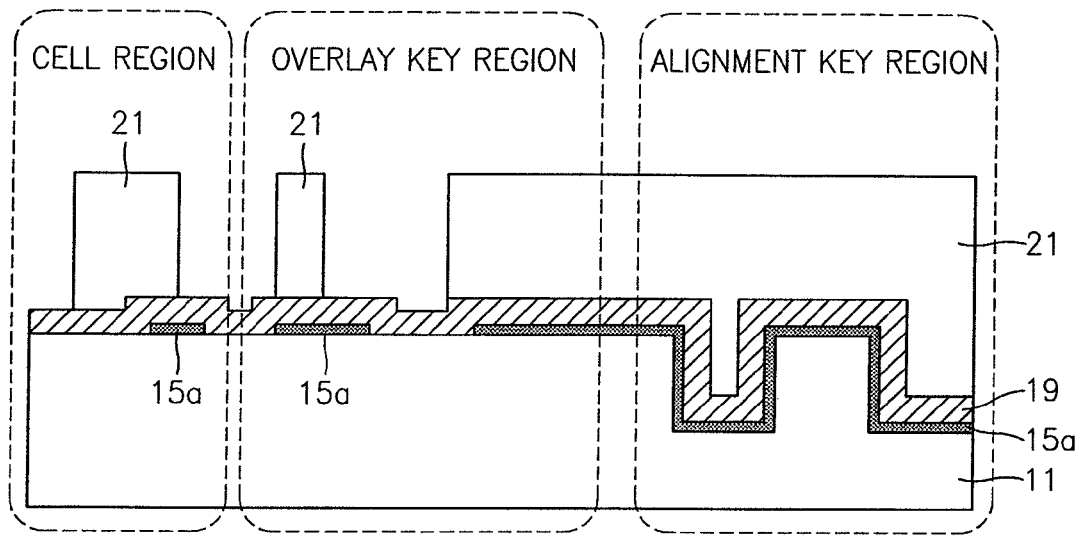
Figure 4:
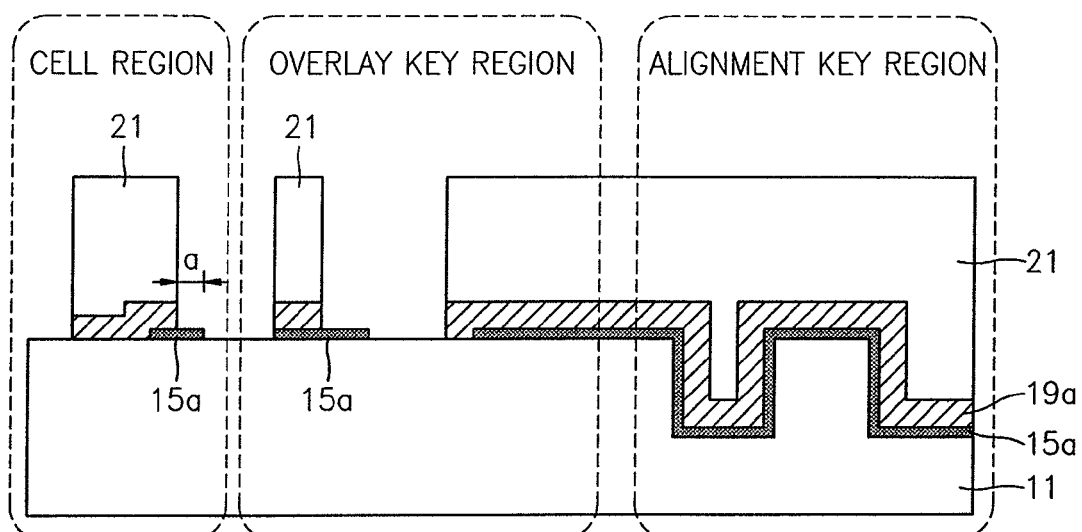

The present invention will now be described more fully with reference to the accompanying drawings, in which exemplary embodiments of the invention are shown. This invention may, however, be embodied in many different forms and should not be construed as being limited to the embodiments set forth herein. Rather, the embodiments are provided so that this disclosure is thorough and complete and fully conveys the concept of the invention to those skilled in the art. In the drawings, the thicknesses of layers may be exaggerated for clarity, and the same reference numerals are used to denote the same elements throughout the drawings.

Figure 5:
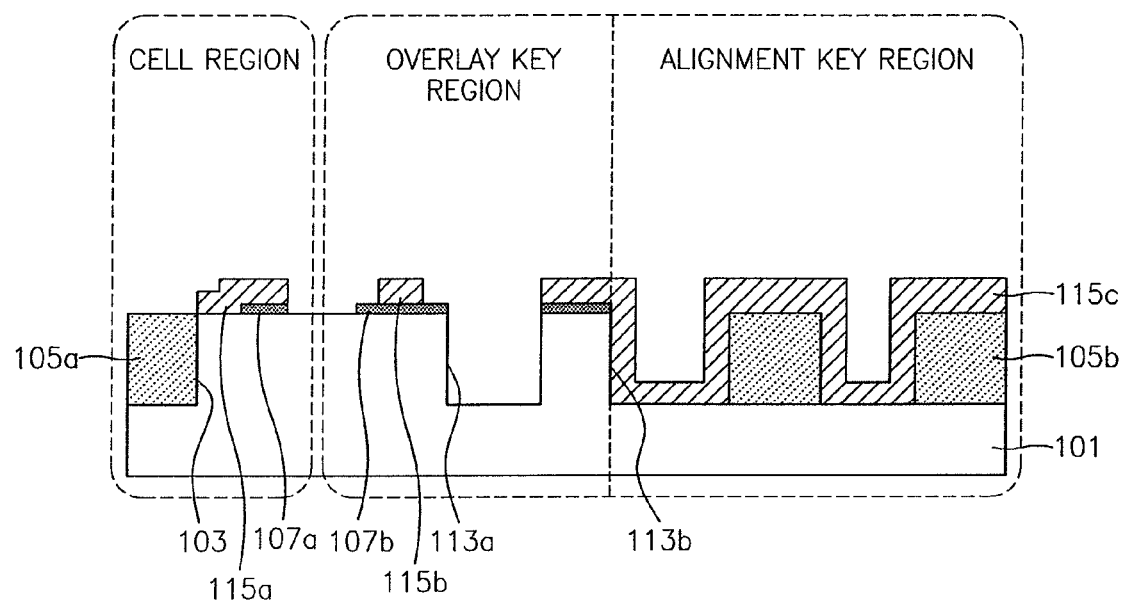
FIG. 5 is a cross-sectional view of an integrated circuit semiconductor device with an overlay key and an alignment key according to an embodiment of the present invention.

FIG. 5 is a cross-sectional view of an integrated circuit semiconductor device with an overlay key and an alignment key according to an embodiment of the present invention.

In the semiconductor device according to the present embodiment of the invention, a cell region, an overlay key region, and an alignment key are defined in a silicon substrate 101. The alignment key region is primarily used to align an exposure mask at a precise position on the top of a silicon substrate during fabrication of an integrated circuit semiconductor device. The overlay key region is secondarily used to measure an overlay state between a photoresist pattern and a material pattern formed on the silicon substrate to correct overlay and alignment errors during fabrication of the integrated circuit semiconductor device.

The cell region is formed in a first portion of the silicon substrate 101. In the cell region, a first trench 103 is formed in the silicon substrate 101. A first buried insulating layer 105a is filled in the first trench 103. The first buried insulating layer 105a is formed of an oxide layer. In the cell region, a first insulating pattern 107a and a first conductive pattern 115a are sequentially formed on the silicon substrate 101.

The first insulating pattern 107a is formed to a thickness of about 100 Å to about 300 Å. The first insulating pattern 107a is formed of any suitable insulating material, such as, for example, $SiO_2$, SiON, $Si_3N_4$ or any combination thereof. In particular, the first insulating pattern 107a may be formed of a triple layer of $SiO_2$, $Si_3N_4$, and $SiO_2$. The first conductive pattern 115a is formed of a doped polysilicon layer.

The overlay key region is formed in a second portion of the silicon substrate 101. In the overlay key region, a second trench 113a is formed in the silicon substrate 101. A second insulating pattern 107b, which is used as an overlay key through the second trench 113a, is formed on the silicon substrate 101 in the overlay key region.

The second insulating pattern 107b is formed to a thickness of about 100 Å to about 300 Å. The second insulating pattern 107b is formed of any suitable insulating material, such as, for example, $SiO_2$, SiON, $Si_3N_4$ or any combination thereof. In particular, the second insulating pattern 107b may be formed of a triple layer of $SiO_2$, $Si_3N_4$, and $SiO_2$.

The second insulating pattern 107b used as an overlay key in the overlay key region is too thin on its own to be used with an overlay measuring apparatus. However, a step difference between the second insulating pattern 107b and the second trench 113a is sufficiently large so that position data of the second insulating pattern 107b can be obtained using an optical laser of an overlay measuring apparatus. Thus, overlay and alignment errors can be corrected using the second insulating pattern 107b as the overlay key.

A second conductive pattern 115b is formed on the second insulating pattern 107b and at a precise position by correcting overlay and alignment errors using the second insulating pattern 107b. The second conductive pattern 115b is formed of a doped polysilicon layer.

The alignment key region is formed in a third portion of the silicon substrate 101. In the alignment key region, a third trench 113b used as an alignment key is formed in the silicon substrate 101. A second buried insulating layer 105b is formed in the third trench 113b in the alignment key region. The second buried insulating layer 105b is formed of an oxide layer. A third conductive pattern 115c is formed on the second buried insulating layer 105b and in the third trench 113b. The third conductive pattern 115c is formed of a doped polysilicon layer.

Figure 6:
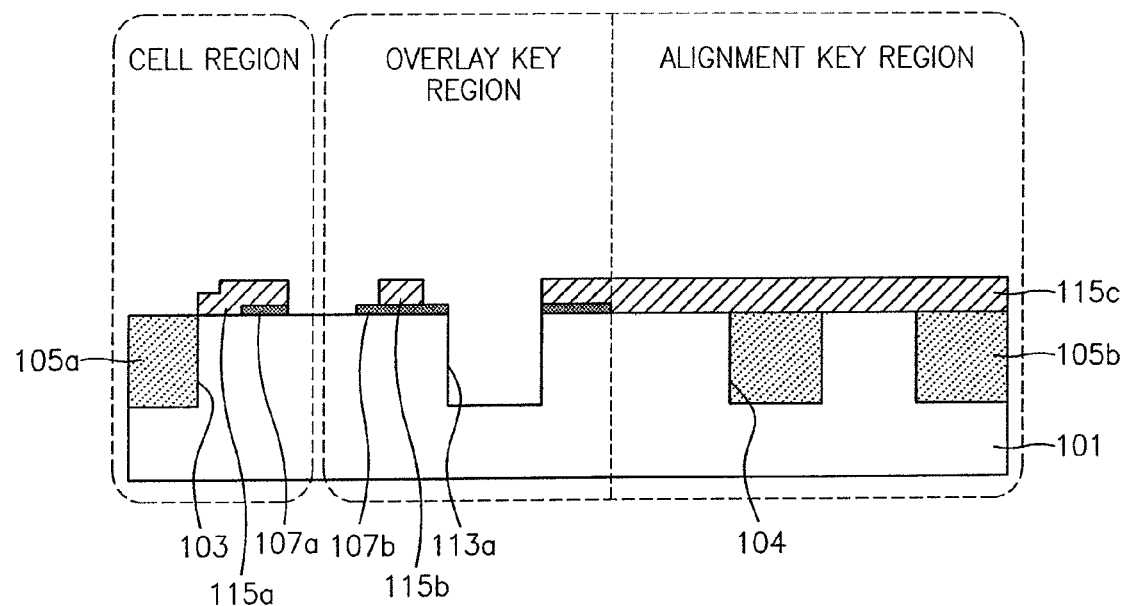
FIG. 6 is a cross-sectional view of an integrated circuit semiconductor device with an overlay key and an alignment key according to another embodiment of the present invention.

FIG. 6 is a cross-sectional view of an integrated circuit semiconductor device with an overlay key and an alignment key according to another embodiment of the present invention. In FIG. 6, the same reference numerals as in FIG. 5 are used to denote the same elements.

The structure and effects of the integrated circuit semiconductor device of the present embodiment are the same as those of the integrated circuit semiconductor device of the previous embodiment except that a silicon substrate 101 disposed in an alignment key region is not etched. In the alignment key region, an alignment key region trench 104, which is used as an alignment key, is formed. A second buried insulating layer 105b is formed in the alignment key region trench 104. A third conductive pattern 115c is formed on the second buried insulating layer 105b and the silicon substrate 101.

FIGS. 7 through 14 are cross-sectional views illustrating a method of fabricating an integrated circuit semiconductor device with an overlay key and an alignment key according to an embodiment of the invention.

Figure 7:
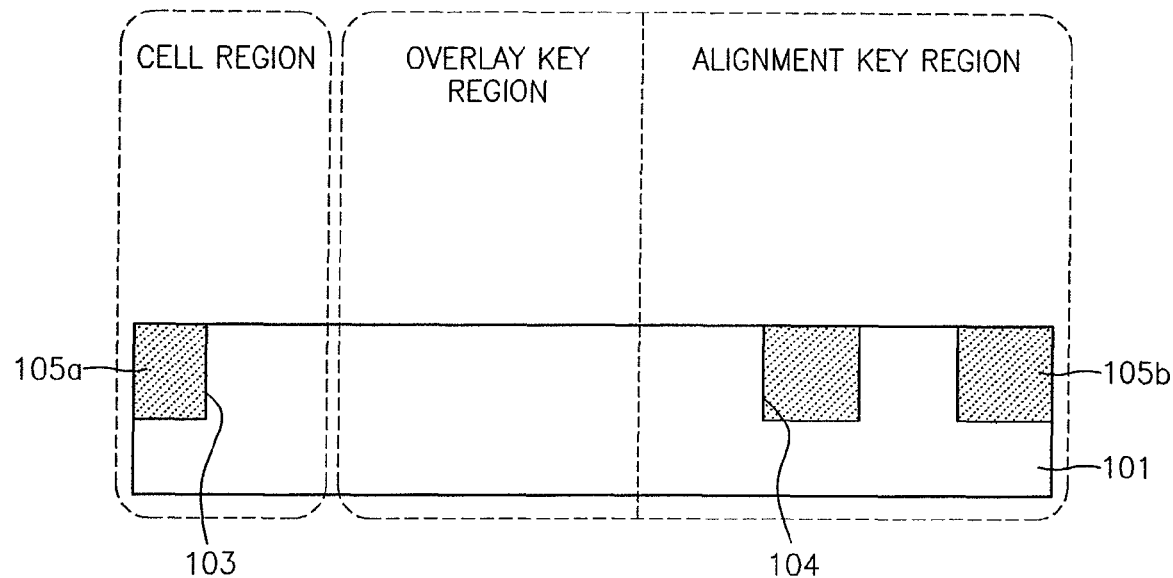
FIGS. 7 through 14 are cross-sectional views illustrating a method of fabricating an integrated circuit semiconductor device with an overlay key and an alignment key according to an embodiment of the present invention.

Referring to FIG. 7, a cell region, an overlay key region, and an alignment key region are defined in a silicon substrate 101. In the cell region, a first trench 103 and a first buried insulating layer 105a are formed in the silicon substrate 101. In the alignment key region, an alignment key region trench 104 is formed in the silicon substrate 101 to function as an alignment key. When a photoresist pattern is formed, the alignment key region is primarily used as the alignment key. A second buried insulating layer 105b is formed in the alignment key region trench 104. Each of the first buried insulating layer 105a and the second buried insulating layer 105b is formed of an oxide layer. The first trench 103, the alignment key region trench 104, the first buried insulating layer 105a, and the second buried insulating layer 105b are formed by a trench isolation process.

Figure 8:
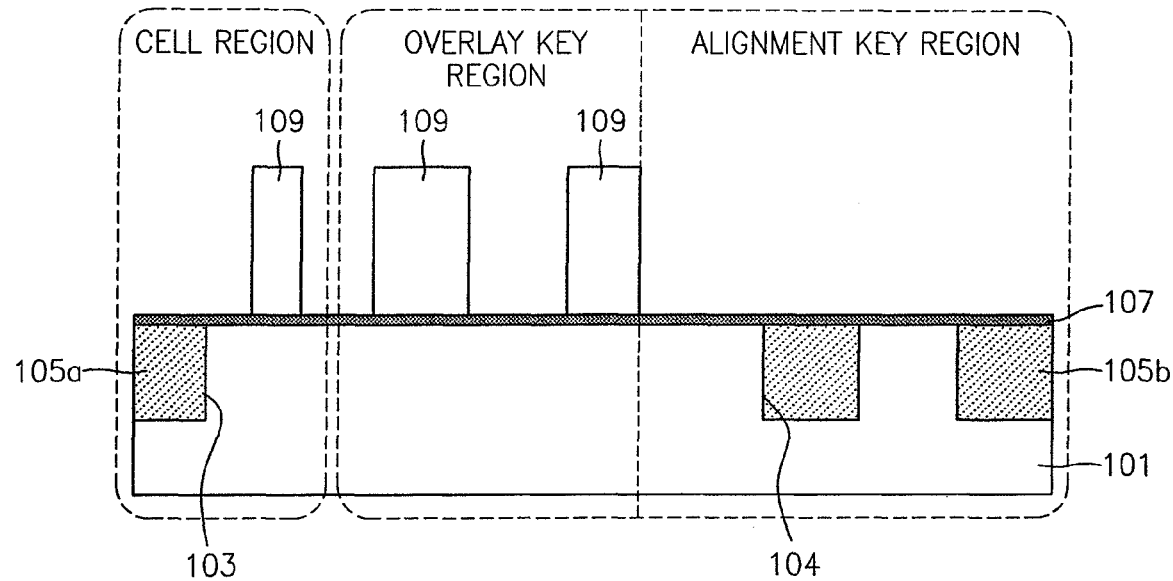

Referring to FIG. 8, a thin insulating layer 107 having a thickness of about 100 Å to about 300 Å is formed on the entire surface of the silicon substrate 101 with the overlay key region and the alignment key region. The insulating layer 107 is formed on the silicon substrate 101 in the cell region and the overlay key region, and on the second buried insulating layer 105b in the alignment key region. The insulating layer 107 is formed of any suitable insulating material, such as, for example, $SiO_2$, SiON, $Si_3N_4$ or any combination thereof. In particular, the insulating layer 107 may be formed of a triple layer of $SiO_2$, $Si_3N_4$, and $SiO_2$.

A first photoresist pattern 109 is formed on the insulating layer 107 in the cell region and the overlay key region while exposing the insulating layer 107 in the alignment key region. The first photoresist pattern 109 in the cell region is used for formation of the integrated circuit semiconductor device, while the first photoresist pattern 109 in the overlay key region is used for formation of an overlay key.

Figure 9:
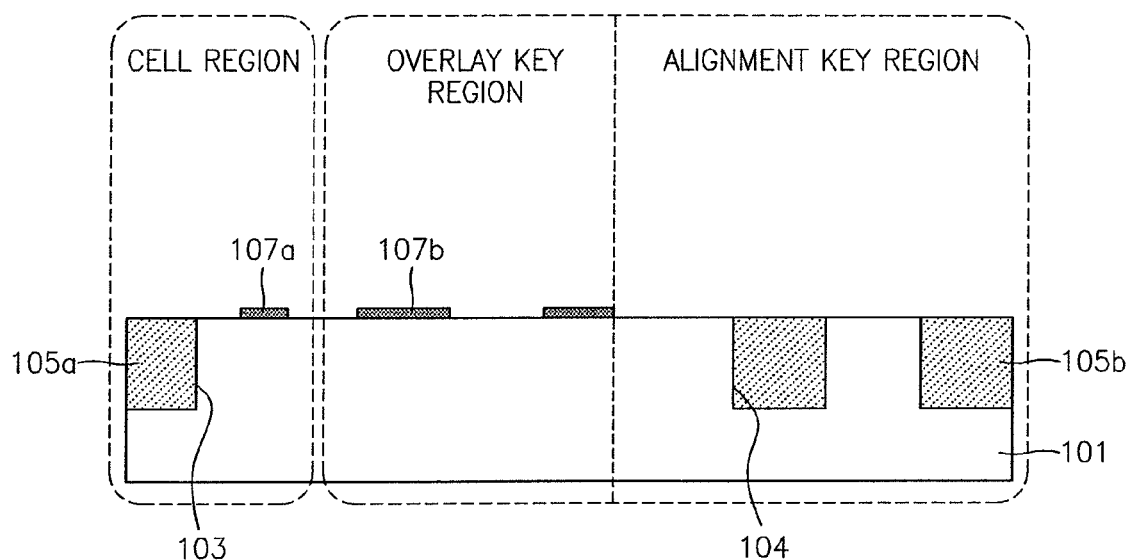

Referring to FIG. 9, the insulating layer 107 is etched by using the first photoresist pattern 109 as a mask, thereby forming a first insulating pattern 107a and a second insulating pattern 107b. The first insulating pattern 107a in the cell region is used as part of the integrated circuit semiconductor device, whereas the second insulating pattern 107b in the overlay key region functions as an overlay key capable of correcting overlay and alignment errors in a subsequent process of forming a conductive pattern.

Figure 10:
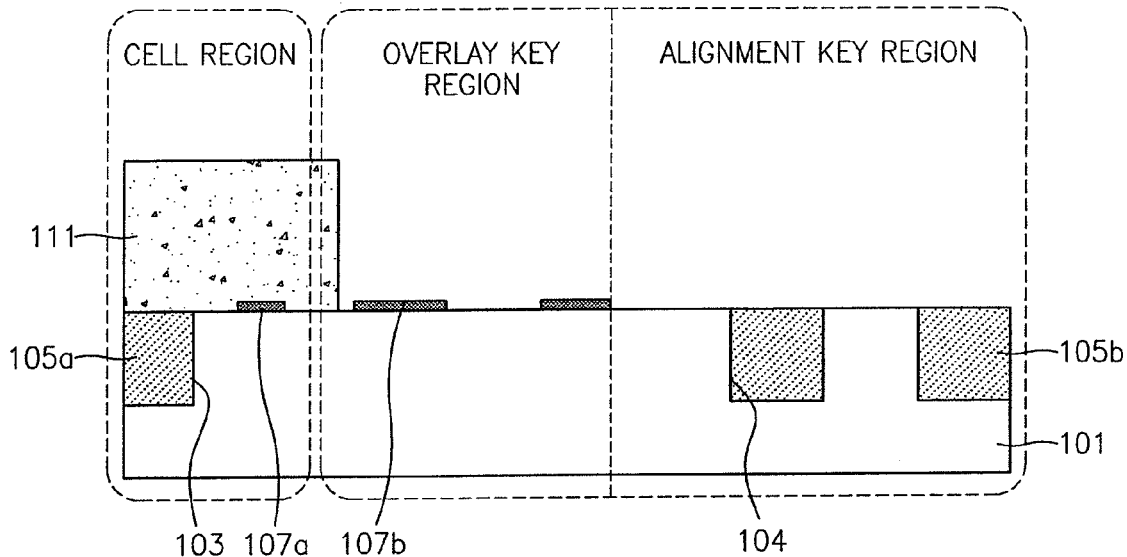
Figure 11:
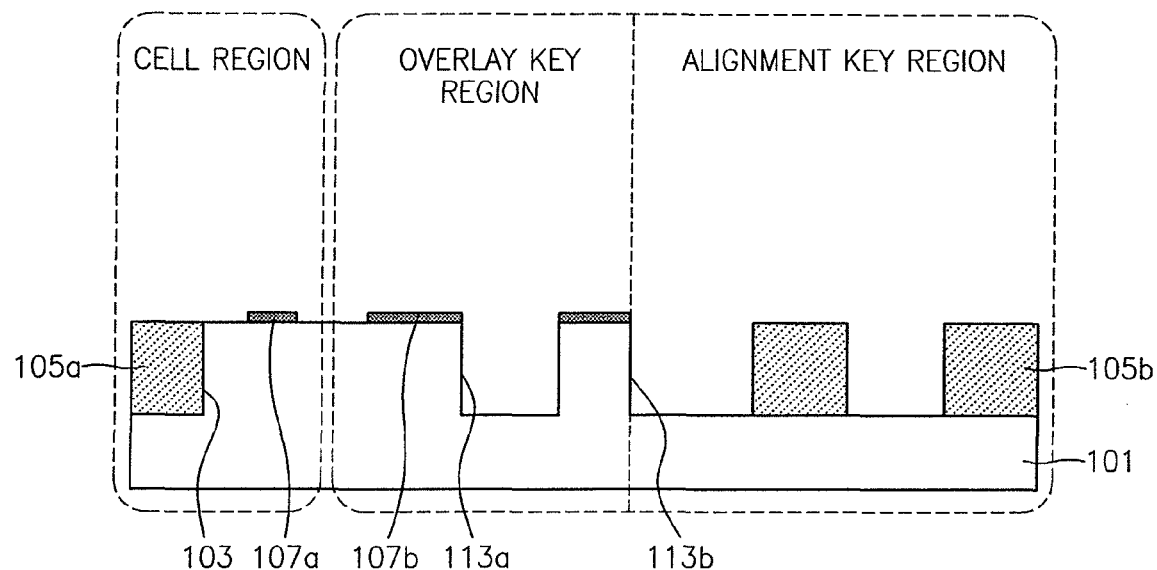

Referring to FIGS. 10 and 11, a second photoresist pattern 111 is formed to cover the cell region and expose the overlay key region and the alignment key region. The silicon substrate 101 is etched by using the second photoresist pattern 111, the insulating patterns 107a and 107b, and the buried insulating layers 105a and 105b as a mask, thereby forming a second trench 113a and a third trench 113b. The silicon substrate 101 in the overlay key region and the alignment key region is plasma etched using one of $Cl_2$ gas, HBr gas, and $BCl_3$ gas.

The second trench 113a formed in the overlay key region allows the second insulating pattern 107b to function as an overlay key. That is, since a step difference between the second insulating pattern 107b and the second trench 113a is sufficiently large, position data of the second insulating pattern 107b can be obtained using an optical laser of an overlay measuring apparatus. Thus, the second insulating pattern 107b can be used as the overlay key.

Also, the third trench 113b formed in the alignment key region is used as an alignment key. That is, the third trench 1113b is used as the alignment key for forming an exposure mask at a precise position when a predetermined pattern is formed on the silicon substrate 101.

Figure 12:
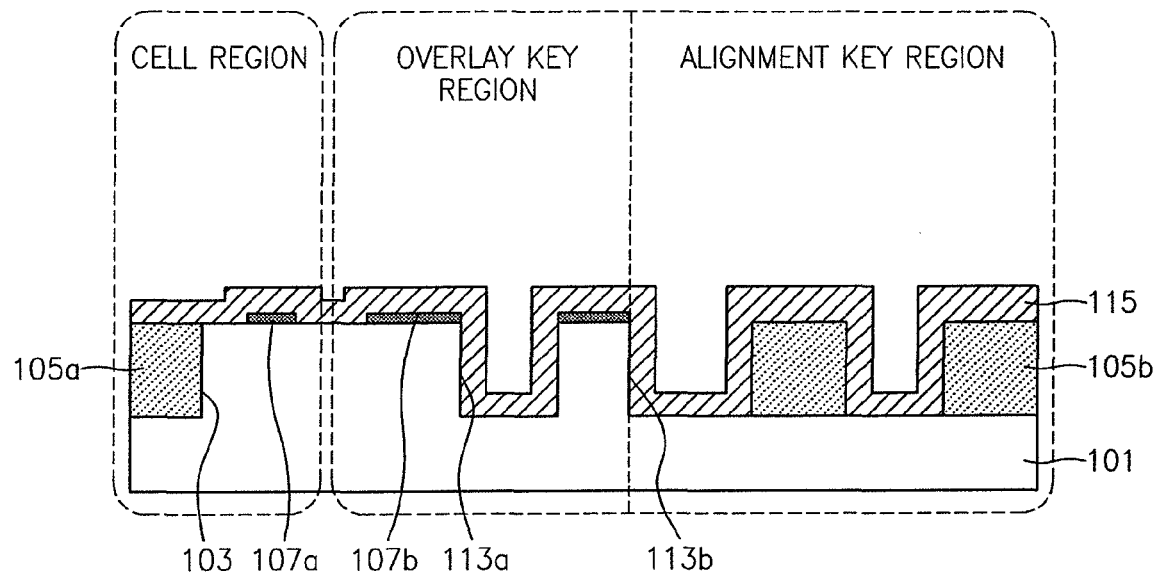

Referring to FIG. 12, a conductive layer 115 is formed on the entire surface of the cell region, the overlay key region, and the alignment key region. The conductive layer 115 is formed on the silicon substrate 101 and the first insulating pattern 107a in the cell region, on the silicon substrate 101, the second trench 113a, and the second insulating pattern 107b in the overlay key region, and on the third trench 113b and the second buried insulating layer 105b in the alignment key region. The conductive layer 115 is formed of a doped polysilicon layer.

Figure 13:
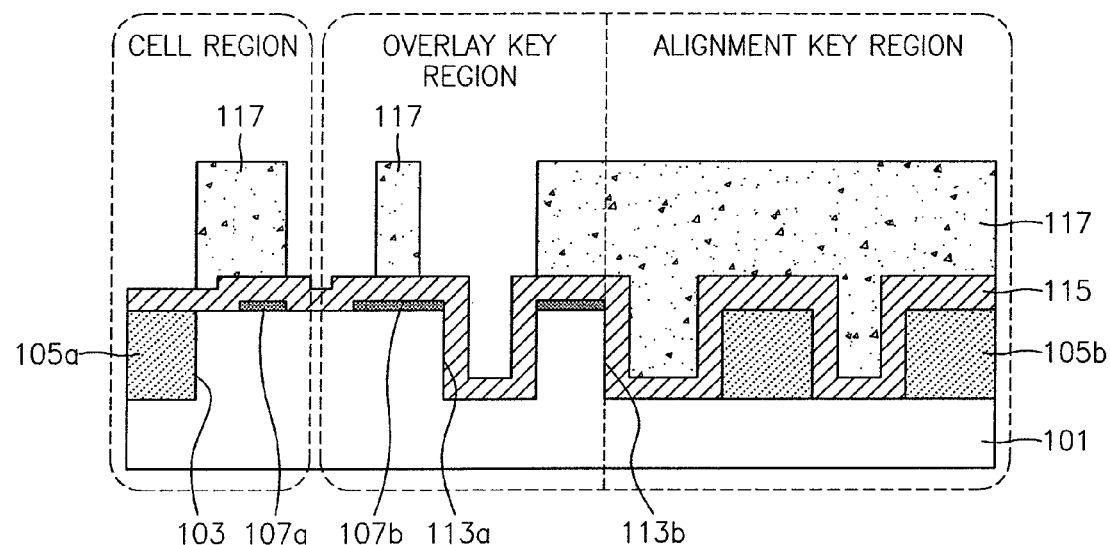

Referring to FIG. 13, a third photoresist pattern 117 is formed using a photolithography process on the conductive layer 115 to cover the alignment key region. Although the second insulating pattern 107b used as the overlay key in the overlay key region has a small thickness, since a step difference between the second insulating pattern 107b and the second trench 113a is large, position data of the second insulating pattern 107b can be obtained using an optical laser of the overlay measuring apparatus.

Thus, overlay and alignment errors of the third photoresist pattern 117 are secondarily corrected by using the second insulating pattern 107b as the overlay key. That is, an overlay state between the third photoresist pattern 117 and the second insulating pattern 107b is measured by the overlay measuring apparatus and then the alignment errors are corrected, thereby forming a third photoresist pattern 117 at a precise position.

Figure 14:
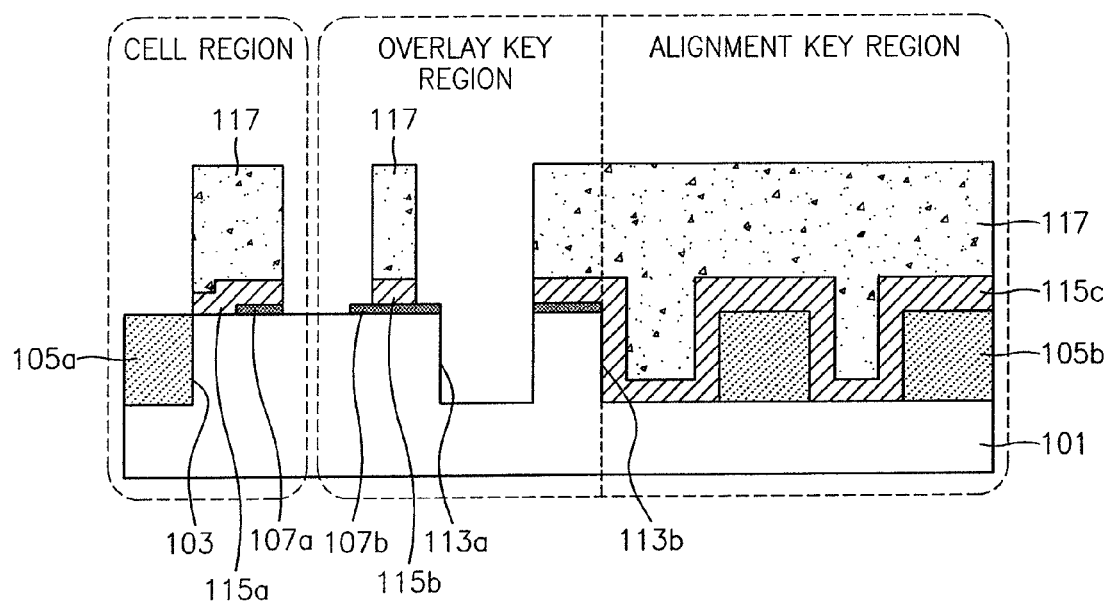

Referring to FIG. 14, the conductive layer 115 is etched using the third photoresist pattern 117 as a mask, thereby forming a first conductive pattern 115a, a second conductive pattern 115b, and a third conductive pattern 115c. As described above, alignment errors between the third photoresist pattern 117 and the second insulating pattern 107b are corrected using the second insulating pattern 107b as the overlay key. Thus, alignment errors do not occur between the first insulating pattern 107a and the first conductive pattern 115a in the cell region. Thereafter, the third photoresist pattern 117 is removed, thereby forming the structure shown in FIG. 5.

FIGS. 15 through 19 are cross-sectional views illustrating a method of fabricating an integrated circuit semiconductor device with an overlay key and an alignment key according to another embodiment of the invention.

Specifically, in FIGS. 15 through 19, the same reference numerals as in FIGS. 7 through 14 are used to denote the same elements. The method of the present embodiment of the invention is the same as the method of the previous embodiment of the invention shown in FIGS. 7 through 19 except that a second photoresist pattern 111 is formed also in an alignment key region and thus a third trench 113b is not formed in the alignment key region.

Figure 15:
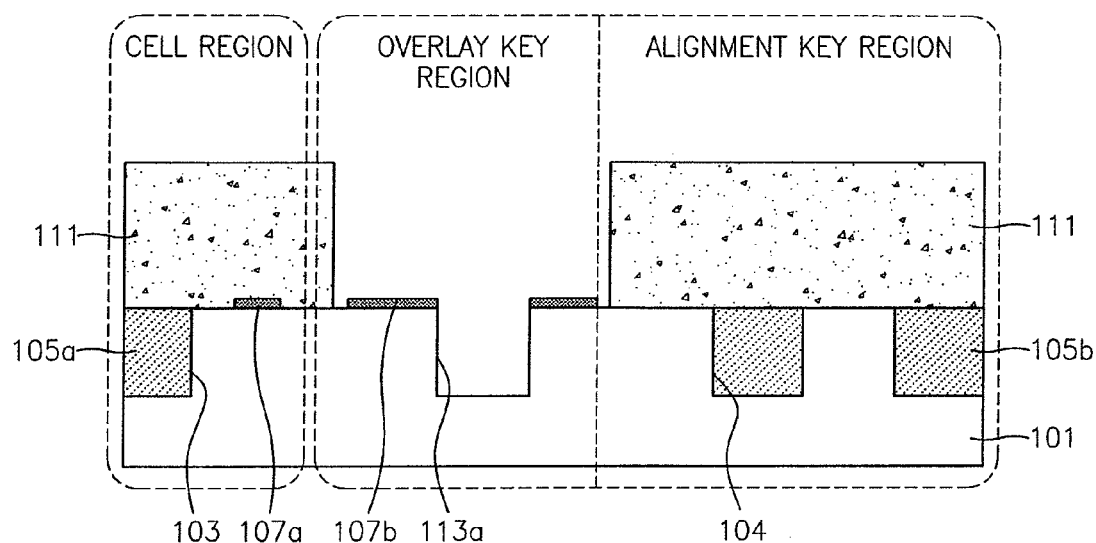
FIGS. 15 through 19 are cross-sectional views illustrating a method of fabricating an integrated circuit semiconductor device with an overlay key and an alignment key according to another embodiment of the invention.
Figure 16:
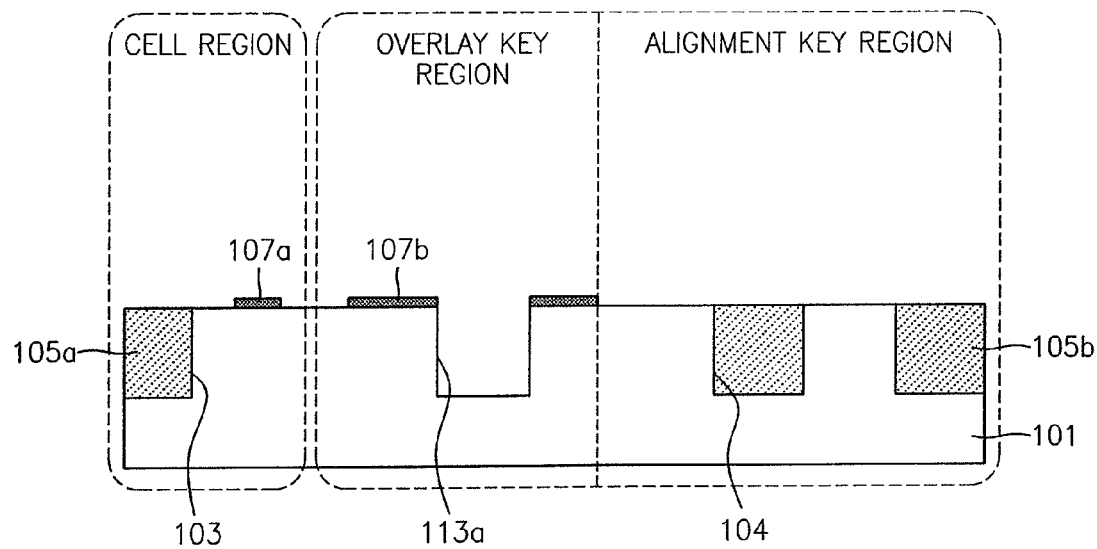

In the present embodiment of the invention, processes shown in FIGS. 7 through 9 are performed. Thus, a first insulating pattern 107a and a second insulating pattern 107b are formed on a silicon substrate 101. The first insulating pattern 107a formed in a cell region is used as part of an integrated circuit semiconductor device, while the second insulating pattern 107b formed in an overlay key region functions as an overlay key capable of correcting alignment errors in a subsequent process of forming a conductive pattern. Referring to FIGS. 15 and 16, a second photoresist pattern 111 is formed to cover the cell region and an alignment key region and to expose the overlay key region. The silicon substrate 101 is etched using the second photoresist pattern 111 and the second insulating pattern 107b as a mask, thereby forming a second trench 113a. The silicon substrate 101 in the overlay key region is plasma etched using one of $Cl_2$ gas, HBr gas, and $BCl_3$ gas.

As described above, the second trench 113a formed in the overlay key region allows the second insulating pattern 107b to function as an overlay key in a subsequent process. That is, since a step difference between the second insulating pattern 107b and the second trench 113a is sufficiently large, position data of the second insulating pattern 107b can be obtained using an optical laser of the overlay measuring apparatus. Thus, the second insulating pattern 107b can be used as the overlay key.

Also, the alignment key region trench 104 formed in the alignment key region is used as an alignment key. That is, when a predetermined pattern is formed on the silicon substrate 101, the alignment key region trench 104 is used as an alignment key for forming an exposure mask at a precise position.

Figure 17:
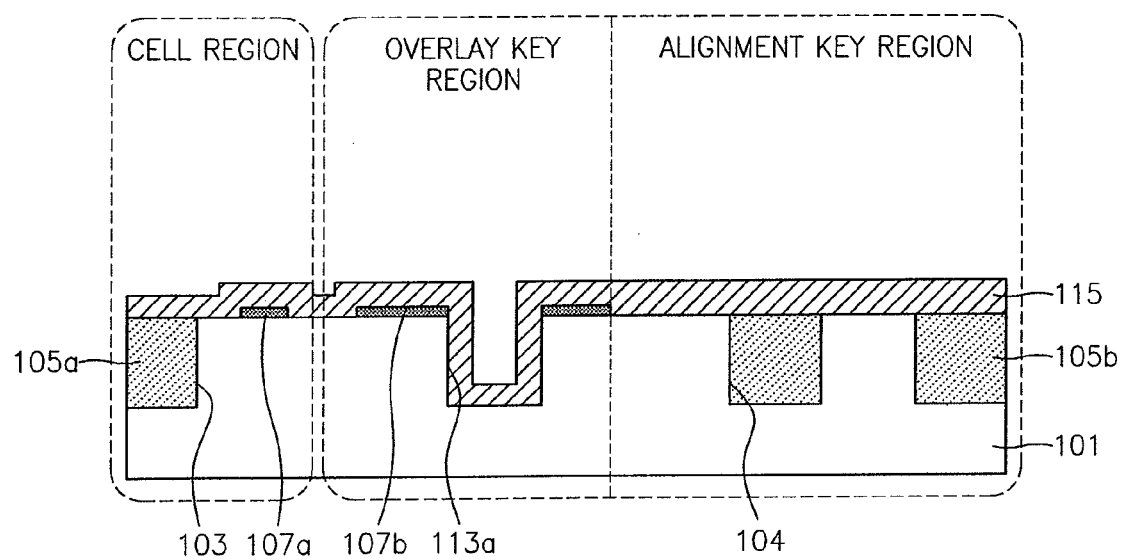

Referring to FIG. 17, a conductive layer 115 is formed on the entire surface of the cell region, the overlay key region, and the alignment key region. The conductive layer 115 is formed on the silicon substrate, a first buried insulating layer 105a, and a first insulating pattern 107a in the cell region, on the silicon substrate 101, a second trench 113a, and a second insulating pattern 107b in the overlay key region, and on the silicon substrate 101 and a second buried insulating layer 105b in the alignment key region.

Figure 18:
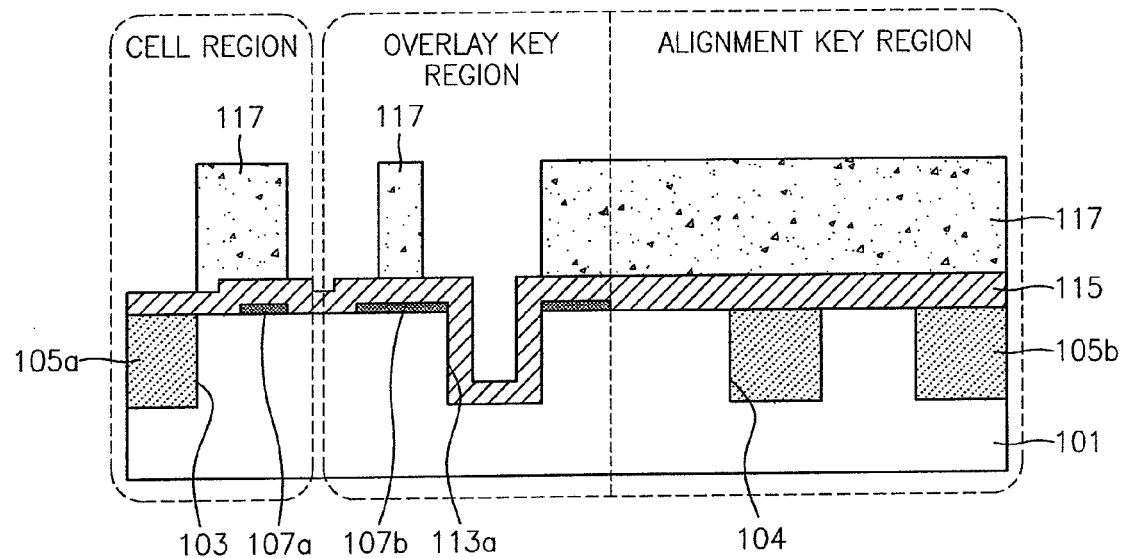

Referring to FIG. 18, a third photoresist pattern 117 is formed using a photolithography process on the conductive layer 115 to cover the alignment key region. In the overlay key region, since a step difference between the second insulating pattern 107b and the second trench 113a is sufficiently large, position data of the second insulating pattern 107b can be obtained using an optical laser of the overlay measuring apparatus.

Thus, the alignment errors of the third photoresist pattern 111 are corrected using the second insulating pattern 107b as the overlay key. That is, an overlay state between the third photoresist pattern 117 and the second insulating pattern 107b is measured using the overlay measuring apparatus, thereby forming a third photoresist pattern 117 at a precise position.

Figure 19:
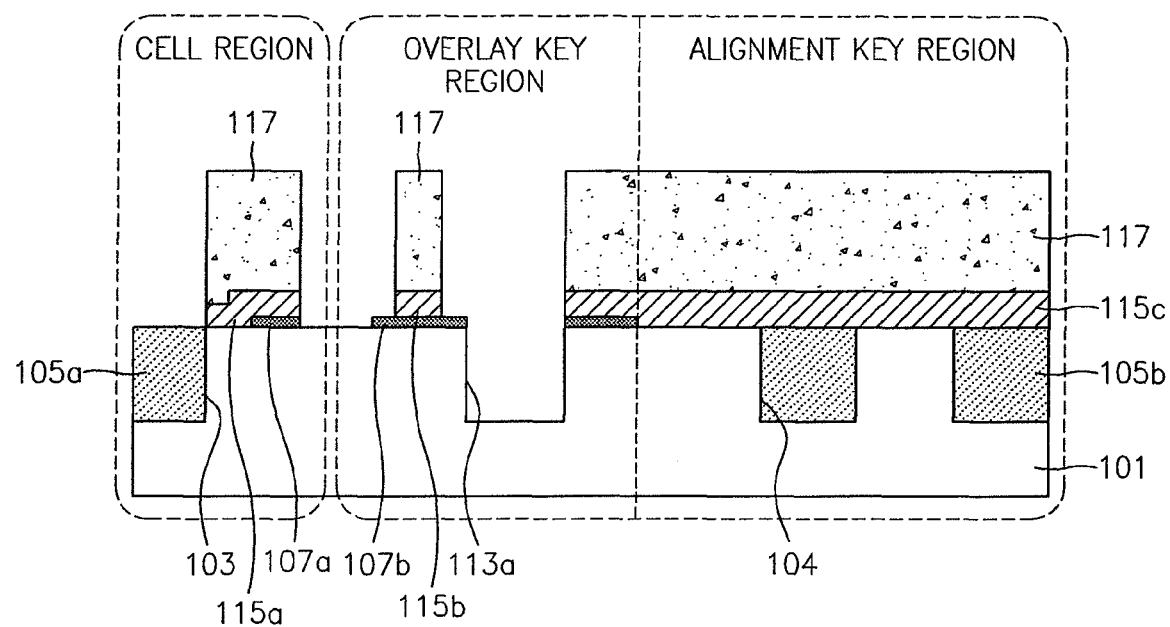

Referring to FIG. 19, the conductive layer 115 is etched using the third photoresist pattern 117 as a mask, thereby forming a first conductive pattern 115a, a second conductive pattern 115b, and a third conductive pattern 115c. As described above, since the alignment errors between the third photoresist pattern 117 and the second insulating pattern 107b are corrected using the second insulating pattern 107b as the overlay key, alignment errors do not occur between the first insulating pattern 107a and the first conductive pattern 115a in the cell region.

According to various exemplary embodiments of the present invention, an exposure mask is formed at a precise position on a silicon substrate by using a trench as an alignment key in an alignment key region, thereby forming a photoresist pattern on a conductive layer formed on an insulating pattern. Also, an overlay state between a photoresist pattern and an insulating pattern is measured in an overlay key region so as to correct overlay and alignment errors.

In exemplary embodiments of the present invention, since a step difference between an insulating pattern and a trench is sufficiently large, position data of the insulating pattern can be obtained using an optical laser of an overlay measuring apparatus. Thus, overlay and alignment errors between a photoresist pattern and the insulating pattern can be corrected.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims.

What is claimed is:

1. An integrated circuit semiconductor device comprising:
   a cell region formed in a first portion of a silicon substrate, the cell region including a first trench formed in the silicon substrate, a first buried insulating layer filled in the first trench, a first insulating pattern formed over the silicon substrate, and a first conductive pattern formed over the first insulating pattern;
   an overlay key region formed in a second portion of the silicon substrate, the overlay key region including a second trench formed in the silicon substrate, a second insulating pattern formed over the silicon substrate and used as an overlay key, and a second conductive pattern formed over the second insulating pattern by correcting overlay and alignment errors using the second insulating pattern; and
   an alignment key region formed in a third portion of the silicon substrate, the alignment key region including a third trench formed in the silicon substrate and used as an alignment key, a second buried insulating layer formed in the third trench, and a third conductive pattern formed over the second buried insulating layer and the third trench.

2. The device of claim 1, wherein each of the first insulating pattern and the second insulating pattern is formed of a material selected from a group consisting of $SiO_2$, SiON, $Si_3N_4$ and any combination thereof.

3. The device of claim 1, wherein each of the first insulating pattern and the second insulating pattern is formed of a triple layer of $SiO_2$, $Si_3N_4$, and $SiO_2$.

4. The device of claim 1, wherein each of the first insulating pattern and the second insulating pattern is formed to a thickness of about 100 Å to about 300 Å.

5. The device of claim 1, wherein each of the first conductive pattern, the second conductive pattern, and the third conductive pattern is formed of a doped polysilicon layer.

6. An integrated circuit semiconductor device comprising:
   a cell region formed in a first portion of a silicon substrate, the cell region including a first trench formed in the silicon substrate, a first buried insulating layer filled in the first trench, a first insulating pattern formed over the silicon substrate, and a first conductive pattern formed over the first insulating pattern;
   an overlay key region formed in a second portion of the silicon substrate, the overlay key region including a second trench formed in the silicon substrate, a second insulating pattern formed over the silicon substrate and used as an overlay key, and a second conductive pattern formed over the second insulating pattern by correcting overlay and alignment errors using the second insulating pattern; and
   an alignment key region formed in a third portion of the silicon substrate, the alignment key region including a third trench formed in the silicon substrate and used as an alignment key, a second buried insulating layer filled in the third trench, and a third conductive pattern formed over the second buried insulating layer and the silicon substrate.

7. The device of claim 6, wherein each of the first insulating pattern and the second insulating pattern is formed of a material selected from a group consisting of $SiO_2$, SiON, and $Si_3N_4$ or any combination thereof.

8. The device of claim 6, wherein each of the first insulating pattern and the second insulating pattern is formed to a thickness of about 100 Å to about 300 Å.

9. The device of claim 6, wherein each of the first conductive pattern, the second conductive pattern, and the third conductive pattern is formed of a doped polysilicon layer.

* * * * *